US007865787B2

(12) United States Patent  
Haberla et al.

(10) Patent No.: US 7,865,787 B2
(45) Date of Patent: Jan. 4, 2011

(54) TESTING EMBEDDED CIRCUITS WITH THE AID OF A SEPARATE SUPPLY VOLTAGE

(75) Inventors: Holger Haberla, Kranichfeld (DE); Soeren Lohbrandt, Buessleben (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 738 days.

(21) Appl. No.: 11/721,010

(22) PCT Filed: Dec. 9, 2005

(86) PCT No.: PCT/DE2005/002223

§ 371 (c)(1),
(2), (4) Date: Jun. 6, 2007

(87) PCT Pub. No.: WO2006/061010

PCT Pub. Date: Jun. 15, 2006

(65) Prior Publication Data

US 2009/0164857 A1    Jun. 25, 2009

(30) Foreign Application Priority Data

Dec. 10, 2004   (DE) .................. 10 2004 059 506

(51) Int. Cl.
G11C 29/00 (2006.01)
G01R 31/28 (2006.01)
G01R 31/02 (2006.01)
G01R 31/26 (2006.01)
G01R 31/36 (2006.01)

(52) U.S. Cl. .............. 714/719; 714/724; 714/729; 714/742; 324/763; 324/765; 324/771

(58) Field of Classification Search ......... 714/719, 714/724, 729, 742; 324/763, 765, 771
See application file for complete search history.

(56) References Cited

U.S. PATENT DOCUMENTS 5,068,604 A * 11/1991 Van de Lagemaat ........ 324/537

(Continued)

FOREIGN PATENT DOCUMENTS

| EP | 0 434 137 B1 | 4/1997 |
| EP | 0 715 178 B1 | 9/2003 |
| JP | 10253717 A | 9/1998 |
| JP | 11337908 | * 12/1999 |

OTHER PUBLICATIONS

English translation of International Preliminary Report on Patentability and Written Opinion for PCT/DE2005/002223; Jun. 10, 2007.*

(Continued)

Primary Examiner—John J Tabone, Jr.
(74) Attorney, Agent, or Firm—Duane Morris LLP

(57) ABSTRACT

Disclosed is an arrangement for testing an embedded circuit as part of a whole circuit located on a semiconductor wafer. Disclosed is an integrated semiconductor arrangement comprising a whole circuit (8) with inputs and outputs (7), an embedded circuit (1) that is part of the whole circuit (8) and is equipped with embedded inputs and outputs which are not directly connected to the inputs and outputs (7) of the whole circuit (8); a test circuit (2, 5, 6) that is connected to the embedded inputs and outputs in order to feed and read out signals during a test phase. A separate supply voltage connection (3) is provided which is used for separately supplying the embedded circuit (1) and the test circuit (2, 5, 6) independently of a supply voltage of the whole circuit (8) such that the inputs of the whole circuit do not have to be connected for testing the embedded circuit while only the inputs and outputs that are absolutely indispensable for testing the embedded circuit need to be connected to a test system.

29 Claims, 1 Drawing Sheet

U.S. PATENT DOCUMENTS

Figure 1:
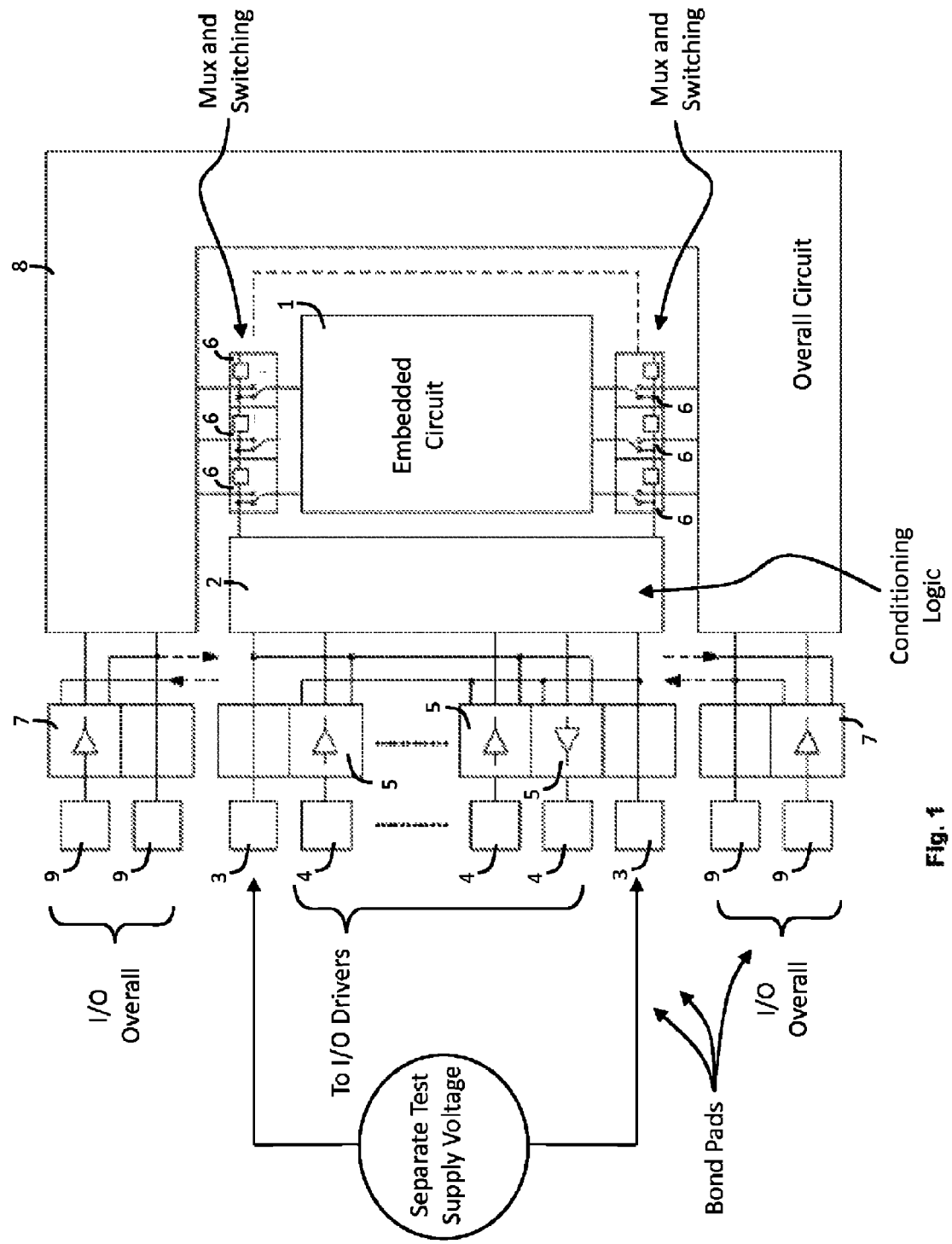

| | | | |
|---|---|---|---|
| 5,130,645 A | 7/1992 | Levy et al. | |
| 5,565,801 A | 10/1996 | Ernst | |
| 5,717,696 A * | 2/1998 | Gabillard et al. | 714/721 |
| 5,764,225 A * | 6/1998 | Koshobu | 345/211 |
| 5,956,567 A | 9/1999 | Tomita et al. | |
| 5,996,102 A * | 11/1999 | Haulin | 714/740 |
| 6,798,236 B2 * | 9/2004 | Shimizu et al. | 326/27 |
| 7,296,202 B2 * | 11/2007 | Richter | 714/728 |
| 2002/0125904 A1 | 9/2002 | Eldridge | |
| 2005/0012686 A1 * | 1/2005 | Osame et al. | 345/39 |

OTHER PUBLICATIONS

International Search Report for PCT/DE2005/002223; Completed Mar. 28, 2006.

International Preliminary Report on Patentability and Written Opinion for PCT/DE2005/002223; Jun. 10, 2007.

\* cited by examiner

TESTING EMBEDDED CIRCUITS WITH THE AID OF A SEPARATE SUPPLY VOLTAGE

The invention relates to an assembly for testing an embedded circuit that is a part of an overall circuit or a whole circuit located on a semiconductor wafer (wafer) or positioned in a package.

Known are arrangements or assemblies of embedded circuits, for which a method of testing on a semiconductor wafer includes 1. connecting the embedded circuit with existing inputs and outputs by a multiplexer for testing the embedded circuit. This method is based on the fact that the number of inputs and outputs of the embedded circuit is equal to or less than the number of inputs and outputs of the overall circuit.

The advantage of this arrangement relies on the fact that the embedded circuit may be testes in a completely parallel manner, thereby allowing the usage of the same test program independently of the application. A further advantage is the possibility to perform the test on the semiconductor wafer (wafer test) and also in the individual device (final test).

A disadvantage of this method is the increased effort in terms of wiring connections, in particular when a plurality of embedded circuits to be tested are provided, thereby typically resulting in an increase of the required semiconductor area, and the applicability for only those cases where the overall circuit has at least the same number of inputs and outputs compared to the embedded circuit. Moreover, each non-used input has to be connected to a predetermined voltage level during the test, unless risking a non-controllable behavior of the overall circuit caused by non-connected inputs, as is typical for CMOS circuits, which results in a non-testability of the embedded circuit.

2. Connecting the embedded circuit with existing inputs and outputs during the test. The precondition of at least the same number of inputs and outputs of the embedded block and the overall circuit according to the known solution of item 1 is circumvented by using a controller that sequentially connects the lower number of input ports and/or output ports of the overall circuit with the inputs and/or outputs of the embedded circuit by means of multiplexers.

The advantage apparently resides in the independency of the number of inputs and outputs of the overall circuit with respect to the inputs and outputs of the embedded circuit.

A disadvantage of this technique is the usage of an additional circuit, an increased effort for the wiring as well as the necessity to connect all non-used inputs with a predetermined voltage level during the test, unless risking a non-controllable behaviour of the overall circuit caused by non-connected inputs, as is typical for CMOS circuits, thereby resulting in a non-testability of the embedded circuit.

3. connecting all inputs and outputs of the embedded circuit to a serial shift register having parallel inputs and outputs, wherein during normal operation the parallel inputs and outputs of the serial shift register are switched in a transparent mode, thereby allowing non-modified supply of signals of an external circuit to the inputs of the embedded circuit and receipt of non-modified output signals of the embedded circuit at the inputs of the external circuit. During the test mode, however, test patterns may serially be loaded into the shift register by various methods and may be applied to the inputs of the embedded circuit in parallel, the outputs signals of the embedded circuit are written into the shift register in parallel and are serially transferred to the outside.

The advantage of this arrangement resides in that the embedded circuit or the multiple embedded circuits, respectively, may be tested by means of only a few additional inputs and outputs of the overall circuit.

A disadvantage is the increase of the semiconductor area required by the additional shift registers and an appropriate circuit for controlling the shift registers. By using the shift registers in the data path, an increase of the signal propagation time occurs. Furthermore, the need exists that all non-used inputs have to be connected to a fixed voltage level for the test, since otherwise a non-controllable behavior of the overall circuit caused by non-connected inputs may result, as is typical for CMOS circuits, thereby resulting in a non-testability of the embedded circuit.

It is an object of the present invention to provide an arrangement which does not necessitate to connect the inputs of the overall circuit for testing the embedded circuit so that only those inputs and outputs have to be connected with the test system that are actually required.

According to one aspect of the claimed invention the object is solved by an integrated semiconductor assembly. This semiconductor assembly comprises an overall circuit having inputs and outputs and an embedded circuit included in the overall circuit and having embedded inputs and outputs without a direct connection to the inputs and outputs of the overall circuit. The semiconductor assembly further comprises a test circuit connected to the embedded inputs and outputs for applying and reading signals during a test phase and a separate supply voltage terminal that is provided for separately supplying the embedded circuit and the test circuit independently with respect to a supply voltage of the overall circuit during the test phase.

Due to the inventive configuration of the semiconductor circuit, the embedded circuit may completely be tested without requiring the corresponding inputs and outputs of the overall circuit to receive a reference voltage, since the test circuit and the embedded circuit are operated separately by means of the independent supply voltage. In this manner, the floating potential variations typically occurring in CMOS devices may be avoided without requiring open and thus floating inputs and outputs to be connected to an external device.

In a further embodiment, the semiconductor assembly comprises a bond island or bond pad connected to the separate supply voltage terminal. By this measure, the separate supply voltage may be connected at any time after completing the metallization of the semiconductor device, such that a high degree of flexibility may be obtained for selecting the time for testing, both on the basis of the semiconductor wafer and on the basis of a separated state of the wafer.

In a further advantageous embodiment, the test circuit comprises a conditioning logic and driver and switch devices in order to transfer externally supplied signals to the embedded circuit and to transfer signals generated by the embedded circuit to the outside during the test phase. In this way any desired test circuit configuration may be established and efficiently be connected to the embedded circuit.

In a further embodiment, the test circuit comprises switches for isolating the embedded circuit from the remaining overall circuit during the test phase. Thus, a test mode may be initiated in an efficient manner, wherein an influence of the test circuit on the overall circuit is low during normal operation.

In a further embodiment, the test circuit further comprises shift registers that enable a serial input and a serial readout of signals of the embedded inputs and outputs. In this way the number of the additionally required test inputs may be maintained at a low level, wherein nevertheless a parallel input or readout is possible.

In a further embodiment the switch device comprises a multiplexer that connects a respective one of the embedded inputs and outputs of the embedded circuit with a respective one of the inputs and outputs of the overall circuit during the test phase. Thus, by providing the multiplexer, at least some of the inputs and outputs of the overall circuit may be used in an efficient manner also during the test phase, thereby allowing to altogether keep the number of required terminals small, wherein nevertheless non-used inputs and outputs may remain open (not connected) during the test phase due to the separate supply voltage.

In a further embodiment the test circuit is connected with test bond islands or pads. Thus, the test runs may be performed at any time, for instance on the wafer or in a separated state.

In a further embodiment, driver circuits are provided between the test bond pads and the conditioning logic.

In a further embodiment, a connection of a supply voltage of the overall circuit with the separate supply voltage terminal is provided during a normal operation mode. Hence, the embedded circuit is supplied with a voltage during the normal operation phase, thereby ensuring a normal operation.

In a further advantageous embodiment, the test circuit connects the embedded inputs and outputs of the embedded circuit with the inputs and outputs of the overall circuit during the normal operation mode. In this manner switching between the test mode and the normal mode and vice versa may be achieved.

In a further embodiment, the semiconductor assembly further comprises a package and the connection is established via the package such that the testing of the embedded circuit may be accomplished both on the semiconductor wafer and prior to packaging. By establishing the connection via the package, for instance by a contact pin of the package, the assembly may be tested on the wafer as well as in a separated state, wherein for the transition for selecting the normal operation mode for the circuit assembly, it is sufficient to package the assembly so that additional effort may be avoided.

In a further embodiment, the semiconductor assembly comprises a package and the connection is established within the package. Thus, the connection may for instance be established permanently on the basis of entire wafers after the testing by forming a corresponding electric line in the metallization level prior to performing a bond process. This may for instance be accomplished during the manufacturing of solder bumps.

In a further embodiment, the bond pad of the separate supply terminal and a bond pad of the supply voltage of the overall circuit are located in close proximity. Due to this arrangement the connection may be established in an efficient manner, for example during bonding to respective contact pins of a package or the formation of solder bumps, wherein, for instance, both bond pads may be connected to the same package pin.

In a further embodiment, the overall circuit comprises a plurality of embedded circuits, all of which are commonly supplied by the separate supply voltage terminal. In this manner, the testing of the individual embedded circuits may be performed, while all of the inputs and outputs of the overall circuit that are not used during the test do not remain non-connected.

According to another aspect of the present invention, the object is solved by a method for testing an integrated semiconductor assembly comprising an overall circuit that includes an embedded circuit. The method comprises providing a test circuit that enables an exchange of test signals between external test equipment and the embedded circuit, independently of a part of the overall circuit. Furthermore, the embedded circuit and the test circuit are supplied with a separate supply voltage during a test phase without supplying the overall circuit.

The method of the present invention thus enables the testing of the embedded circuit without requiring non-used inputs and outputs of a part of the overall circuit to be connected to a reference voltage.

In a further embodiment, the test circuit and the embedded circuit are connected to a supply voltage for the overall circuit so as to initiate a normal mode of operation of the integrated semiconductor assembly. In this way a transition from the test mode to the normal operation mode may be efficiently accomplished without or with only minor structural measures.

In a further embodiment, the connecting of the test circuit and the embedded circuit with the supply voltage of the overall circuit is accomplished in a permanent manner after completion of the testing. Hence, after the test by providing the permanent connection that may for instance be realised without additional effort, the device is connected for the later usage of the device.

In a further embodiment, the permanent connection is established by packaging the integrated semiconductor assembly. This may be accomplished, for instance, by connecting bond wires to bond pads and package pins or by means of solder bumps.

In a further preferable embodiment, the connecting is accomplished by means of a wiring board after packaging the integrated semiconductor assembly. Thus, the testing of the semiconductor assembly may be performed during any period of the manufacturing process, even in the separated state, wherein the establishing of the connection by means of a wiring board represents very small structural effort.

Further aspects of the present invention and advantageous embodiments and advantages are set forth in the detailed description.

The invention will be explained and completed by way of examples referring to the drawing, in which:

FIG. 1 is a schematic view of an assembly according to an embodiment of the invention comprising input and outputs drivers, a conditioning logic, switches and shift registers and an embedded circuit having a separate supply voltage.

According to the principle of an example, the embedded circuit comprises switches at all inputs and outputs, wherein the switches connect the embedded circuit with the overall circuit during the normal operation mode, while connecting the embedded circuit with a shift register in the test mode. The shift registers and the switches are connected to a conditioning logic that is connected to input and output driver circuits required for the test and including bond pads or bond islands, wherein the input and output driver circuits as well as the embedded circuit are operated by a separate supply voltage having its own bond pad. During normal operation, this separate supply voltage is connected to the supply voltage of the overall circuit and thus enables the common operation of the embedded circuit and the overall circuit. For the testing of the embedded circuit, only the separate supply voltage of the embedded circuit is operated, so that the connection of the inputs of the overall circuit is no longer necessary, whilst testing the embedded circuit is fully possible.

FIG. 1 illustrates an overall circuit 8 comprising an embedded circuit 1 to be tested. The overall circuit 8 has inputs and outputs 7 including bond pads 9 that are not directly connected to the embedded circuit 1.

The embedded circuit 1 in one embodiment comprises switches 6 at each of the inputs and outputs, wherein during normal operation the switches 6 connect the embedded circuit 1 with the overall circuit 8, while connecting the embedded circuit 1 with a shift register 6 during testing. The shift registers and switches 6 are connected to a conditioning logic 2 that connects input and output driver circuits 5 required for the test with bond pads (islands) 4, wherein the input and output driver circuits 5, the conditioning logic 2, the switches and shift registers 6 and the embedded circuit 1 are operated with a separate supply voltage having own bond pad 3.

In other embodiments a test circuit, which is built with the input and output driver circuits 5 and the shift registers and switches 6 as well as the conditioning logic 2 in the above-described embodiment, is comprises other switching means, for instance a multiplexer, such that at least some of the inputs and outputs 7 of the overall circuit 8 may also be used for test purposes, wherein due to decoupling the overall circuit 8 from the supply voltage during the test phase, unused inputs and outputs of the overall circuit 8 may remain open or non-connected. The supply voltage is provided by connector 3.

What is claimed is:

1. An integrated semiconductor assembly comprising:
    an overall circuit (8) having inputs and outputs (7);
    an embedded circuit (1) included in said overall circuit (8), said embedded circuit (1) comprising embedded inputs and outputs haying no direct connection to said inputs and outputs (7) of said overall circuit (8);
    a test circuit connected to said embedded inputs and outputs and configured to apply signals to and to read out signals from the embedded inputs and outputs during a test phase;
    a separate supply voltage terminal (3) adapted to separately supply said embedded circuit (1) and said test circuit (2, 5, 6) with power during the test phase, independently of a supply voltage of said overall circuit (8).

2. The semiconductor assembly of claim 1, wherein said separate supply voltage terminal comprises a bond pad.

3. The semiconductor assembly of claim 1, wherein said test circuit comprises conditioning logic (2) and driver and switch devices (5, 6) for transferring externally applied signals to said embedded circuit (1) and for transferring signals generated by said embedded circuit (1) to an outside during the test phase.

4. The semiconductor assembly of claim 3, wherein said test circuit comprises switches (6) configured to isolate said embedded circuit (1) from the remaining part of said overall circuit during the test phase.

5. The semiconductor assembly of claim 3, wherein said switch device (6) comprises a multiplexer configured to connect a respective one of said embedded inputs and outputs of said embedded circuit (1) with a respective one of said inputs and outputs (7) of the overall circuit during the test phase.

6. The semiconductor assembly of claim 3, wherein said test circuit is connected to test bond pads (4), and wherein said driver circuits (5) are connected between said test bond pads and said conditioning logic.

7. The semiconductor assembly of claim 4, wherein said test circuit further comprises shift registers (6) connected so as to serially input and serially readout signals of the embedded inputs and outputs.

8. The semiconductor assembly of claim 1, wherein said test circuit is connected to test bond pads (4).

9. The semiconductor assembly of claim 1, wherein a connection of a supply voltage of said overall circuit (8) with said separate supply voltage terminal is provided during normal operation.

10. The semiconductor assembly of claim 9, wherein during normal operation said test circuit connects said embedded inputs and outputs of the embedded circuit (1) to said inputs and outputs (7) of said overall circuit (8).

11. The semiconductor assembly of claim 9, further comprising a package and wherein said connection is formed via said package such that testing said embedded circuit (1) is performable on a semiconductor wafer or prior to packaging.

12. The semiconductor assembly of claim 9, further comprising a package and wherein said connection is formed within said package.

13. The semiconductor assembly of claim 12, wherein said separate supply voltage terminal and a terminal of the supply voltage of said overall circuit (8) are commonly connected to a package pin, allowing the testing of said embedded circuit (1) only prior to mounting the package.

14. The semiconductor assembly of claim 13, wherein the bond pad of the separate supply voltage terminal is located immediately next to a bond pad of the supply voltage of the overall circuit.

15. The semiconductor assembly of claim 1, wherein said overall circuit (8) comprises a plurality of embedded circuits, all of which are commonly supplied by said separate terminal.

16. The semiconductor assembly of claim 15, wherein each of the plurality of embedded circuits comprises shift registers and switches (6) all controlled by a conditioning logic (2).

17. An assembly comprising:
    an overall circuit (8) having inputs and outputs (7) including bond pads (9), said overall circuit (8) including an embedded circuit (1) not directly connected to said inputs and outputs (7) including said bond pads (9), wherein all of said inputs and outputs of said embedded circuit (1) are connected to switches (6),
    (i) said switches (6) connecting said embedded circuit (1) with said overall circuit (8) during a normal operation,
    (ii) said switches (6) connecting said embedded circuit (1) with a shift register (6) during a test phase, wherein said shift register and switches (6) are connected to a conditioning logic (2) that is connected to input and output driver circuits (5) having bond pads (4) for a testing, wherein said input and output driver circuits (5), said conditioning logic (2), said switches and shift register (6) and said embedded circuit (1) are operable with separate supply voltages.

18. The assembly of claim 17, wherein said overall circuit is comprised of a plurality of embedded circuits, wherein each embedded circuit is associated with respective shift registers and switches (6) controlled by said conditioning logic (2) and operated on the basis of said separate supply voltage via its own bond pad.

19. The assembly of claim 17, wherein during normal operation, the separate supply voltage at a bond pad (3) is connected with a supply voltage of said overall circuit (8) and said shift registers and switches (6) connect said inputs and outputs of said embedded circuit (1) with the inputs and outputs (7) of said overall circuit.

20. The assembly of claim 19, wherein the connection of the separate supply voltage with the supply voltage of the overall circuit is formed on a printed wiring board outside the package of the integrated circuit, such that the testing of the embedded circuit (1) is performable on a semiconductor wafer containing at least one said overall circuit and embedded circuit as well as in a package therefor.

21. The assembly of claim 19, wherein the connection of the separate supply voltage with the supply voltage of the overall circuit is formed within a package of the integrated circuit by positioning the bond pad for the separate supply voltage (3) immediately next to the bond pad of the supply voltage of the overall circuit and by bonding both bond pads to a common package pin, wherein the testing of the embedded circuit (1) is performable on a semiconductor wafer prior to packaging.

22. An assembly having
an overall circuit (8) comprising inputs and outputs (7) including bond pads (9), wherein said overall circuit (8) includes an embedded circuit (1) that is not directly connected with the inputs and outputs (7) including the bond pads (9),
wherein all of the inputs and outputs of the embedded circuit (1) are connected to shift registers and switches (6), wherein during a normal operation the switches (6) connect the embedded circuit (1) with the overall circuit (8), while in a test mode each of the inputs and outputs of the embedded circuit (1) is connected with a respective one of shift registers (6),
wherein the shift registers and switches (6) are connected with a conditioning logic (2) connected to input and output driver circuits (5) having bond pads (4) and required for the testing, wherein the conditioning logic (2), the switches and shift registers (6) and the embedded circuit (1) are operated by a separate supply voltage having its own bond pad (3).

23. A method for testing an integrated semiconductor assembly including an overall circuit and an embedded circuit included therein, the method comprising the steps of:
(i) providing a test circuit enabling exchange of test signals between an external test equipment and the embedded circuit independently of a part of the overall circuit,
(ii) during a test phase, separately supplying the embedded circuit and the test circuit with a separate supply voltage without supplying the overall circuit.

24. The method of claim 23, further comprising connecting the test circuit and the embedded circuit with a supply voltage of the overall circuit, so as to initiate a normal operation mode of the integrated semiconductor assembly.

25. The method of claim 24, wherein connecting the test circuit and the embedded circuit with a supply voltage of the overall circuit is accomplished in a permanent manner after the test phase.

26. The method of claim 24, wherein connecting is established by a printed wiring board after packaging the integrated semiconductor assembly.

27. The method of claim 25, wherein the permanent connection is established by packaging the integrated semiconductor assembly.

28. The method of claim 23, wherein separate bond pads are used for exchanging signals with the embedded circuit during the test phase.

29. The method of claim 23, wherein at least some bond pads of inputs and outputs of the overall circuit are used for exchanging signals with the embedded circuit during the test phase.

* * * * *

UNITED STATES PATENT AND TRADEMARK OFFICE
CERTIFICATE OF CORRECTION

PATENT NO. : 7,865,787 B2  
APPLICATION NO. : 11/721010  
DATED : January 4, 2011  
INVENTOR(S) : Haberla et al.

Page 1 of 1

It is certified that error appears in the above-identified patent and that said Letters Patent is hereby corrected as shown below:

In Column 5, Claim 1, line 36, "haying" should read --having--.

Signed and Sealed this  
Twenty-third Day of August, 2011

David J. Kappos  
*Director of the United States Patent and Trademark Office*